United States Patent
Garten et al.

(10) Patent No.: US 10,263,570 B2
(45) Date of Patent: Apr. 16, 2019

(54) AMPLIFIER ARRANGEMENT AND METHOD

(71) Applicant: Rohde & Schwarz GmbH & Co. KG, München (DE)

(72) Inventors: Orell Garten, Ohorn (DE); Raimon Göritz, Berlin (DE)

(73) Assignee: ROHDE & SCHWARZ GMBH & CO. KG, München (DE)

( * ) Notice: Subject to any disclaimer, the term of this patent is extended or adjusted under 35 U.S.C. 154(b) by 0 days.

(21) Appl. No.: 15/825,751

(22) Filed: Nov. 29, 2017

(65) Prior Publication Data

US 2018/0323751 A1 Nov. 8, 2018

(30) Foreign Application Priority Data

May 5, 2017 (EP) .................................... 17169761

(51) Int. Cl.
| | |
|---|---|
| *H03F 1/48* | (2006.01) |
| *H03F 1/26* | (2006.01) |
| *H03F 1/42* | (2006.01) |
| *H03F 3/191* | (2006.01) |
| *H03F 3/21* | (2006.01) |
| *H03F 3/20* | (2006.01) |

(52) U.S. Cl.
CPC ............ *H03F 1/486* (2013.01); *H03F 1/26* (2013.01); *H03F 1/42* (2013.01); *H03F 3/191* (2013.01); *H03F 3/20* (2013.01); *H03F 3/211* (2013.01); *H03F 2200/198* (2013.01); *H03F 2200/204* (2013.01); *H03F 2200/36* (2013.01); *H03F 2200/39* (2013.01)

(58) Field of Classification Search
CPC ....................................................... H03F 1/486
USPC ........................................................... 330/126
See application file for complete search history.

(56) References Cited

U.S. PATENT DOCUMENTS

| | | | |
|---|---|---|---|
| 3,444,475 A | 5/1969 | Seidel | |
| 5,519,434 A | 5/1996 | Fasquel | |
| 6,268,768 B1 | 7/2001 | Blodgett | |
| 7,170,353 B2 * | 1/2007 | Amano | .................. H03F 1/565 330/295 |
| 7,256,650 B1 * | 8/2007 | Stockert | ............... H03F 1/0216 330/124 R |
| 7,656,964 B1 * | 2/2010 | DeCoste | .................. H03F 3/24 330/149 |

(Continued)

OTHER PUBLICATIONS

European Search Report from European Patent Application No. 17169761.8, dated Oct. 27, 2017, 8 pages.

(Continued)

*Primary Examiner* — Patricia T Nguyen
(74) *Attorney, Agent, or Firm* — Westman, Champlin & Koehler, P.A.

(57) ABSTRACT

The present invention provides an amplifier arrangement for amplifying a broadband signal, the amplifier arrangement comprising a signal splitter configured to receive the broadband signal and output a first split signal and a second split signal, and a balanced amplifier that is coupled to the signal splitter and is configured to amplify the first split signal and the second split signal and is configured to output a single amplified broadband signal based on the amplified first split signal and the amplified second split signal. The present invention further provides a respective method.

14 Claims, 4 Drawing Sheets

(56) References Cited

U.S. PATENT DOCUMENTS

| | | | |
|---|---|---|---|
| 2009/0141183 A1 | 6/2009 | Ecoff et al. | |
| 2015/0070097 A1* | 3/2015 | Bauer | H03F 1/0227 330/296 |
| 2015/0263678 A1* | 9/2015 | Kunihiro | H03F 3/24 330/295 |
| 2018/0205348 A1* | 7/2018 | Barton | H03F 3/189 |

OTHER PUBLICATIONS

Quach et al., "X-Band Receiver Front-End Chip in Silicon Germanium Technology", Silicon Monolithic Integrated Circuits in RF Systems, IEEE Topical Meeting, dated Jan. 23, 2017, 4 pages.

* cited by examiner

AMPLIFIER ARRANGEMENT AND METHOD

CROSS-REFERENCE TO RELATED APPLICATION(S)

This application claims priority to European Patent Application No. 17162481.0, filed on Mar. 23, 2017, which is hereby incorporated by reference in its entirety.

TECHNICAL FIELD

The present invention relates to an amplifier arrangement for amplifying a broadband signal. The present invention further relates to a respective method.

BACKGROUND

Although applicable in principal to any system that requires signal amplification, the present invention and its underlying problem will be hereinafter described in combination with broadband signal amplification.

In modern technology signal amplification is an important task. High power signal amplification is e.g. needed in radar applications, in electromagnetic interference (EMI) tests and the like.

In EMI tests usually high power amplifiers are used for amplifying e.g. broadband test signals that are then emitted to a device under test to verify the behavior of the device under test. Such high power amplifiers may e.g. provide high power amplification in a predefined frequency band that is required for a specific test.

The predefined frequency band is however limited by the cut-off frequencies of the single elements of the amplifiers.

Against this background, there is the need to provide signal amplification with an increased frequency range.

SUMMARY

Accordingly it is provided:

An amplifier arrangement for amplifying a broadband signal, the amplifier arrangement comprising a signal splitter configured to receive the broadband signal and output a first split signal and a second split signal, and a balanced amplifier that is coupled to the signal splitter and is configured to amplify the first split signal and the second split signal and is configured to output a single amplified broadband signal based on the amplified first split signal and the amplified second split signal.

A method for amplifying a broadband signal, the method comprising receiving the broadband signal, splitting the broadband signal into a first split signal and a second split signal, amplifying the first split signal and the second split signal in a balanced amplifier, and outputting a single amplified broadband signal based on the amplified first split signal and the amplified second split signal.

Balanced amplifiers are limited in the available frequency range by the elements of the balanced amplifier, if a single input signal is provided to the balanced amplifier.

Usually the balanced amplifier will have a lower cut-off frequency that is heavily influenced by the input stage of the balanced amplifier. Signals with a frequency below the cut-off frequency of the input stage will e.g. only be forwarded to one of the amplifier units in the balanced amplifier. However these signals will not be coupled out by the output stage that also has the lower cut-off frequency of the input stage.

The present invention is therefore based on providing two input signals to the balanced amplifier, i.e. the first split signal and the second split signal.

The signal splitter may implement a kind of signal demultiplexing. One input port may e.g. be de-multiplexed onto two output ports. This means that the input stage of the balanced amplifier is not fed with a single input signal. Instead the input stage of the balanced amplifier will be fed with two input signals. The cut-off frequency of the input stage of the balanced amplifier will therefore be sort of bypassed.

This means that one amplifier unit of the balanced amplifier may be fed with the first split signal and the other amplifier unit of the balanced amplifier may be fed with the second split signal.

In the output stage as in the input stage the cut-off frequency will also be bypassed and an amplified signal will be output.

The present invention therefore allows increasing the frequency range for signals that may be amplified with the amplifier arrangement compared to the frequency range of signals that may be amplified with traditional balanced amplifier arrangements that only receive a single input signal.

Further embodiments of the present invention are subject of the further subclaims and of the following description, referring to the drawings.

In a possible embodiment, the signal splitter may comprise a splitter input port configured to receive the broadband signal and a first splitter output port and a second splitter output port, wherein the signal splitter may be configured to output the first split signal via the first splitter output port and the second split signal via the second splitter output port.

The signal splitter may e.g. be a passive device that splits the broadband signal into the first and the second split signals. The signal splitter may be frequency dependent. That means that the first and the second split signals may e.g. have different frequency bands.

In a possible embodiment, the signal splitter may comprise a diplexer.

The diplexer may be a frequency selective de-multiplexing device that provides on the first splitter output port the first split signal within a first frequency range and in the second splitter output port the second split signal within a second frequency range. The first and the second frequency ranges may be adjacent to each other or slightly overlap each other.

The first splitter output port may be coupled to the input of the balanced amplifier that is used as input in a traditional balanced amplifier arrangement.

The second splitter output port of the diplexer may e.g. be coupled to the input port of the balanced amplifier that is isolated or e.g. terminated with a 50Ω resistance in a traditional arrangement. It is understood that with the present invention that isolation or termination resistance is not present.

In a possible embodiment, the balanced amplifier may comprise a first directional coupler that is coupled to the signal splitter and is configured to receive the first split signal and the second split signal and to output a first decoupled signal and a second decoupled signal. Further, the balanced amplifier may comprise a first amplifier unit that is coupled to the first directional coupler and is configured to receive and amplify the second decoupled signal, and a second amplifier unit that is coupled to the first directional coupler and is configured to receive and amplify the first decoupled signal. In addition, the balanced amplifier may comprise a second directional coupler that comprises a first coupler input port and a second coupler input port and a first coupler output port and a second coupler output port, wherein the first coupler input port is coupled to the first amplifier unit and the second coupler input port is coupled to the second amplifier unit and wherein the second directional coupler is configured to output the amplified broadband signal via the first coupler output port, wherein the second coupler output port may be isolated or terminated with an isolation resistance of e.g. 50Ω. It is understood that the first coupler output port will provide a mixed signal comprising the amplified second decoupled signal and the amplified first decoupled signal for the signal parts that are within the operational frequency range of the balanced amplifier.

In a possible embodiment, the first directional coupler may comprise a first input port and a second input port and a first output port and a second output port. The first amplifier unit may be coupled to the second output port and the second amplifier unit may be coupled to the second output port.

The first directional coupler, also called −3 dB coupler, hybrid coupler or quadrature coupler, has the characteristics of dividing the input power on one input port into two output ports. However, if a signal is received via the first input port of the first directional coupler, the part of the signal provided on the second output port of the first directional coupler will comprise a 90° phase shift. On the other side, if a signal is received via the second input port of the first directional coupler, the part of the signal provided on the first output port of the first directional coupler will comprise the 90° phase shift. The same applies to the second directional coupler.

With the above arrangement of the balanced amplifier, signals with a frequency below the cut-off frequency of the first input coupler that are provided via the first input port of the first directional coupler will not be output via the second output port of the directional coupler. Further, the first output port of the first directional coupler is coupled via the second amplifier unit and the second directional coupler to the isolated or second output port of the second directional coupler. In addition the second directional coupler may comprise the same cut-off frequency as the first directional coupler. Therefore, no amplified signal of the signal provided via the first input port of the first directional coupler will be available at the first output port of the second directional coupler.

In a possible embodiment, the first splitter output port of the diplexer may be coupled with the first input port of the first directional coupler, and the second splitter output port of the diplexer may be coupled with the second input port of the first directional coupler.

As explained above certain signals provided via the first input port of the first directional coupler may not be present at the first output port of the second directional coupler and are therefore not amplified.

However, if a signal is provided at the second input port of the first directional coupler, this signal will be output at the second output port of the first directional coupler. The second output port of the first directional coupler is coupled via the first amplifier unit to the first input port of the second directional coupler. This signal will therefore be output on the first output port of the second directional coupler.

It is understood, that such an output signal would only be amplified by one of the amplifier units, i.e. the first amplifier unit. The power of the amplification will therefore be about 3 dB (50%) less than for signals that have a frequency above the lower cut-off frequency of the first directional coupler. Therefore such signals may e.g. be amplified with 100 W, if other signals, with higher frequencies, are amplified with 200 W.

However, especially in EMI tests the reduced amplification power may be acceptable, especially in view of the increased bandwidth.

In a possible embodiment, the diplexer may be configured to provide the first split signal via the first splitter output port with a frequency range above a cut-off frequency of the first directional coupler. In addition the diplexer may be configured to provide the second split signal via the second splitter output port with a frequency range below a cut-off frequency of the first directional coupler.

The diplexer may be a frequency selective element and perform a sort of frequency based de-multiplexing.

The diplexer may be arranged or dimensioned such that the first split signal may e.g. comprise a frequency range that is about the same as the frequency range specified for the balanced amplifier if the balanced amplifier where to be used in a traditional arrangement with a single input signal.

The first split signal will therefore be amplified by the amplifier arrangement like a single input signal in a traditional balanced amplifier.

In addition, the diplexer may be arranged or dimensioned such that the second split signal may e.g. comprise a frequency range that is below the frequency range specified for the balanced amplifier if the balanced amplifier where to be used in a traditional arrangement with a single input signal.

This means that the second split signal provided via the second splitter output port will not be coupled from the second input port of the first directional coupler into the first output port of the first directional coupler. This is because the second split signal is below the cut-off frequency of the first directional coupler. Instead the second split signal will be passed from the second output port of the first directional coupler to the first amplifier unit and to the first coupler input port of the second directional coupler and from there to the first output port of the second directional coupler.

A signal provided via the first splitter output of the diplexer will in contrast be provided to both, the first and the second output ports of the first directional coupler and will therefore be amplified by the first and the second amplifier units. Such a signal will also be coupled from the second coupler input port of the second directional coupler into the first output port of the second directional coupler. At the same time will the first input port of the second directional coupler receive the signal from the first amplifier unit and output signal on the first output port.

A signal within a frequency range of the directional couplers will therefore be amplified by the first and the second amplifier units and be combined by the second directional coupler into the first output port.

The amplifier arrangement may therefore be seen as a frequency selective amplifier arrangement with two adjacent frequency bands, wherein the upper frequency band is amplified with double the power than the lower frequency band.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
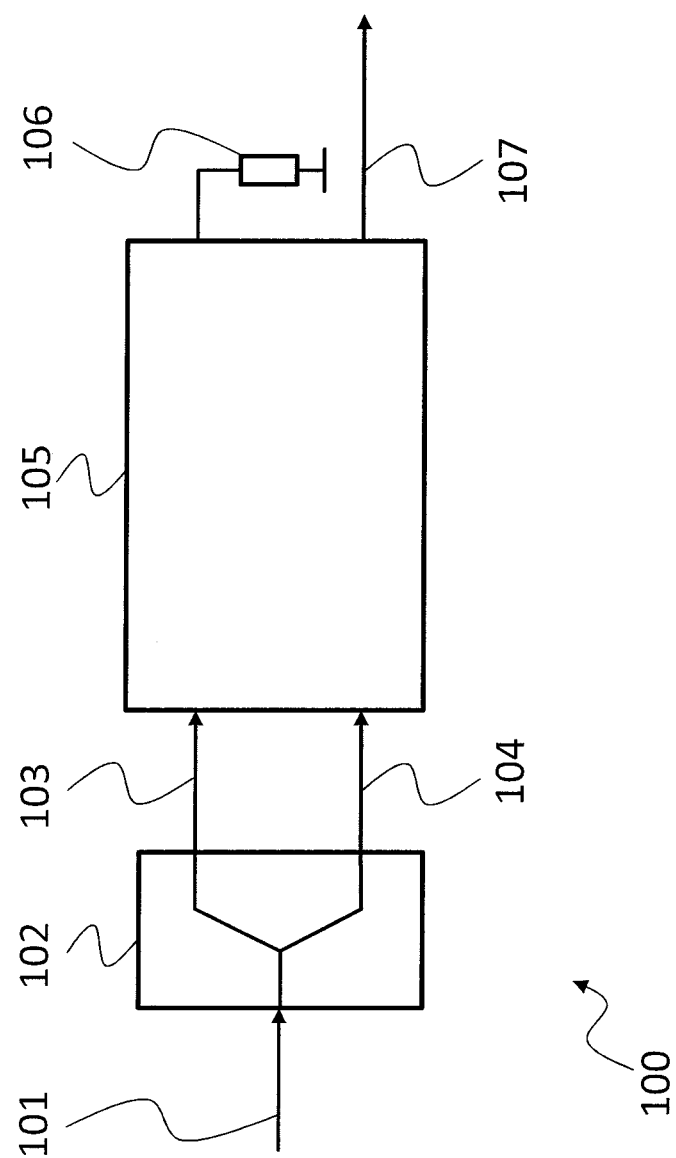
FIG. 1 shows a block diagram of an embodiment of an amplifier arrangement according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a block diagram of an amplifier arrangement 100. The amplifier arrangement 100 serves for amplifying a broadband signal 101. The amplifier arrangement 100 comprises a signal splitter 102 that receives the broadband signal 101 and splits the broadband signal 101 into a first split signal 103 and a second split signal 104. The first split signal 103 and the second split signal 104 are then provided to the balanced amplifier 105. The balanced amplifier 105 outputs a single amplified broadband signal 107 that is based on the first split signal 103 and the second split signal 104. In the amplifier arrangement 100 a second output of the balanced amplifier 105 is terminated with a resistance, e.g. a 50Ω resistance.

"Broadband signal" in this context may refer to a signal that has a frequency spectrum that is wider than the operating frequency spectrum of the balanced amplifier 105. Wider may especially refer to the lower frequency range of the broadband signal 101 extending below the lower cut-off frequency of the balanced amplifier 105.

Usually, the balanced amplifier 105 would be terminated with another resistance 106 at one of the input ports and would only receive the broadband signal 101 as a single input. The internal signal flow of the balanced amplifier 105 would however limit the usable frequency band of the balanced amplifier 105 in such a usual arrangement. Instead with the shown amplifier arrangement 100 the usable frequency range may be extended, although with different amplification levels for the single frequency ranges.

The signal flow in the amplifier arrangement 100 will be explained in greater detail with regard to FIG. 2 below.

Figure 2:
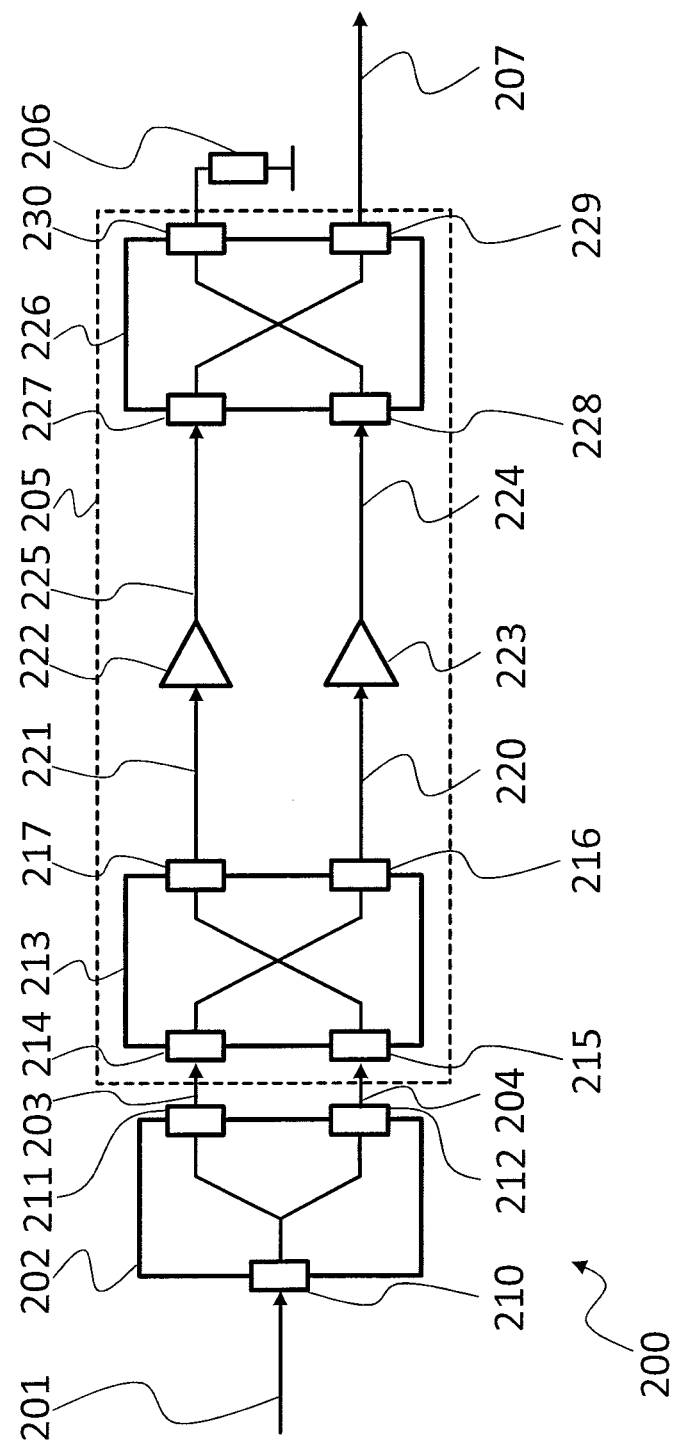
FIG. 2 shows a block diagram of another embodiment of an amplifier arrangement according to the present invention.

FIG. 2 shows a block diagram of an amplifier arrangement 200. The amplifier arrangement 200 is based on the amplifier arrangement 100. Therefore the amplifier arrangement 200 comprises a signal splitter 202 that receives the broadband signal 201 and splits the broadband signal 201 into a first split signal 203 and a second split signal 204. The first split signal 203 and the second split signal 204 are then provided to the balanced amplifier 205. The balanced amplifier 205 outputs a single amplified broadband signal 207 that is based on the first split signal 203 and the second split signal 204.

The signal splitter 202 comprises a splitter input port 210, a first splitter output port 211 and a second splitter output port 212. The signal splitter 202 may e.g. be a diplexer 202.

The balanced amplifier 205 comprises a first directional coupler 213 with a first input port 214, a second input port 215, a first output port 216 and a second output port 217. The first input port 214 is coupled to the first splitter output port 211 and the second input port 215 is coupled to the second splitter output port 212.

The diplexer 202 is configured to provide the first split signal 203 via the first splitter output port 211 with a frequency range above a cut-off frequency of the first directional coupler 213. Further, the diplexer 202 is configured to provide the second split signal 204 via the second splitter output port 212 with a frequency range below a cut-off frequency of the first directional coupler 213.

The first directional coupler 213 provides via the first output port 216 a first decoupled signal 220 and via the second output port 217 a second decoupled signal 221. Decoupled in this context refers to a signal provided at first input port 214 being coupled-out or decoupled onto the first output port 216 and the second output port 217. The same applies to signals received via second input port 215.

A first amplifier unit 222 receives the second decoupled signal 221, and a second amplifier unit 223 receives the first decoupled signal 220.

The first amplifier unit 222 provides the amplified second decoupled signal 225 to a first coupler input port 227 of a second directional coupler 226. The second amplifier unit 223 provides the amplified first decoupled signal 224 to a second coupler input port 228 of the second directional coupler 226. Finally, the second directional coupler 226 provides the amplified broadband signal 207 via a first coupler output port 229. A second coupler output port 230 of the second directional coupler 226 is terminated via resistance 206.

In the following the signal flow of a signal with a frequency within the specified frequency range of the balanced amplifier 205 will be described.

Such a signal will only be provided by the diplexer 202 via the first splitter output port 211 as first split signal 203 to the first input port 214. In the first directional coupler 213 the signal will be coupled-out onto the first output port 216 and the second output port 217. The first amplifier unit 222 will amplify the second decoupled signal 221 and the second amplifier unit 223 will amplify the first decoupled signal 220. In the second directional coupler 226 the amplified first decoupled signal 224 and the amplified second decoupled signal 225 will be combined or coupled-out onto the first coupler output port 229 and will be provided as amplified broadband signal 207.

In the following the signal flow of a signal with a frequency below the specified frequency range of the balanced amplifier 205 will be described.

Such a signal will be provided by the diplexer 202 via second splitter output port 212 as second split signal 204 to the second input port 215 of the first directional coupler 213. Since the signal is below the specified frequency range of the balanced amplifier 205 the first directional coupler 213 will not couple-out the signal onto the first output port 216. Instead the signal will be output only via second output port 217.

The first amplifier unit 222 will then amplify the signal. The second directional coupler 226 will receive the amplified second decoupled signal 225 and output this signal directly via first coupler output port 229.

The signal with a frequency below the specified frequency range of the balanced amplifier 205 is therefore only amplified by the first amplifier unit 222 and not in addition by the second amplifier unit 223.

It is clear, that the amplifier arrangement 200 allows using the amplifier arrangement 200 with signals that comprise frequencies below the specified frequency range of the balanced amplifier 205 even if only with reduced (by ½) amplification power.

For sake of clarity in the following description of the method based FIG. 3 the reference signs used above in the description of apparatus based FIGS. 1-2 will be maintained.

Figure 3:
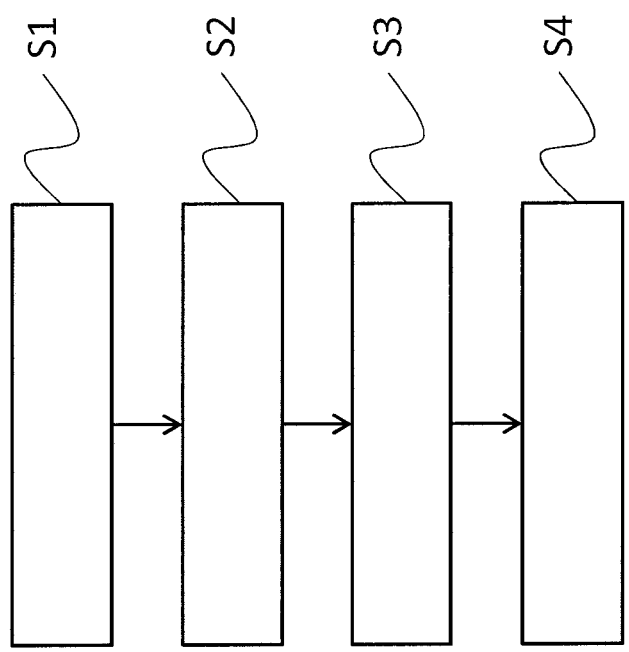
FIG. 3 shows a flow diagram of an embodiment of a method according to the present invention.

FIG. 3 shows a flow diagram of a method for amplifying a broadband signal 101, 201.

The method comprises receiving S1 the broadband signal 101, 201, splitting S2 the broadband signal 101, 201 into a first split signal 103, 203 and a second split signal 104, 204, amplifying S3 the first split signal 103, 203 and the second split signal 104, 204 in a balanced amplifier 105, 205, and outputting S4 a single amplified broadband signal 107, 207 based on the amplified first split signal 103, 203 and the amplified second split signal 104, 204.

The broadband signal 101, 201 may be received via a splitter input port 210 of a signal splitter 102, 202, especially a diplexer 202, and splitting S2 may comprise outputting the first split signal 103, 203 via a first splitter output port 211 and the second split signal 104, 204 via a second splitter output port 212 of the signal splitter 102, 202.

Splitting S2 may comprise providing the first split signal 103, 203 with a frequency range above a cut-off frequency of the first directional coupler 213, and providing the second split signal 104, 204 with a frequency range below a cut-off frequency of the first directional coupler 213.

Amplifying S3 and outputting S4 may be performed in a balanced amplifier and may comprise receiving the first split signal 103, 203 and the second split signal 104, 204 at a first directional coupler 213, and outputting a first decoupled signal 220 and a second decoupled signal 221 via the first directional coupler 213.

Amplifying S3 and outputting S4 may further comprise amplifying the second decoupled signal 221 with a first amplifier unit 222, and amplifying the first decoupled signal 220 with a second amplifier unit 223. The amplified second decoupled signal 225 may be received via a first coupler input port 227 of a second directional coupler 226 and the amplified first decoupled signal 224 may be received via a second coupler input port 228 of a second directional coupler 226. Finally, the single amplified signal may be output via a first coupler output port 229 of the second directional coupler 226.

The second decoupled signal 221 may be provided from a second output port 217 of the first directional coupler 213 to the first amplifier unit 222, and the first decoupled signal 220 may be provided from a first output port 216 of the first directional coupler 213 to the second amplifier unit 223. The first split signal 103, 203 may be provided from the first splitter output port 211 of the diplexer 202 to the first input port 214 of the first directional coupler 213, and the second split signal 104, 204 may be provided from the second splitter output port 212 of the diplexer 202 to the second input port 215 of the first directional coupler 213.

Figure 4:
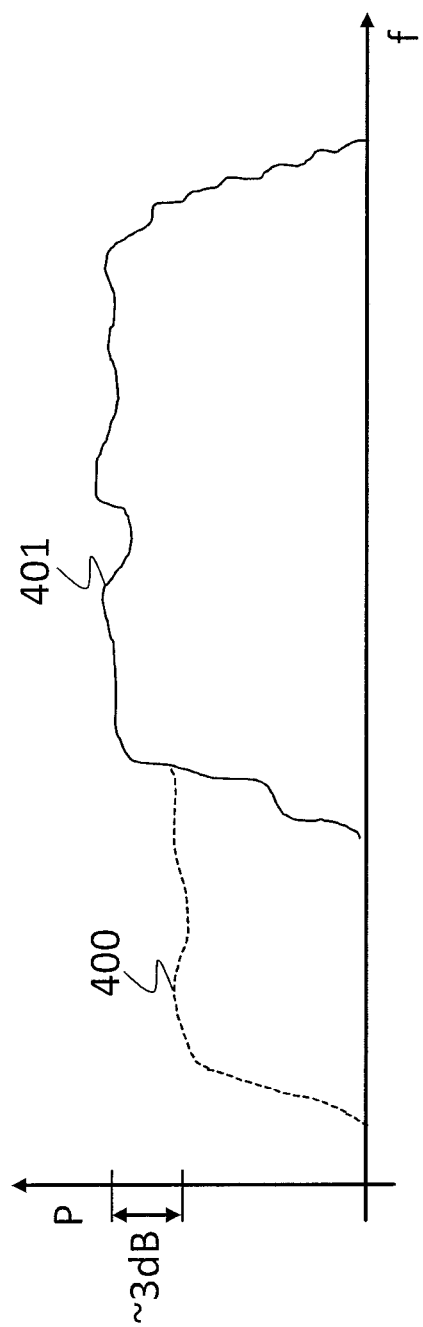
FIG. 4 shows a diagram of amplification power over frequency for an embodiment of an amplifier arrangement according to the present invention.

FIG. 4 shows a diagram of amplification power over frequency for a possible embodiment of an amplifier arrangement 100, 200.

In the diagram of FIG. 4 two curves 400, 401 are shown. The dashed curve 400 represents the frequency range that is below the cut-off frequency of the balanced amplifier 105, 205 of the respective amplifier arrangement 100, 200. The continuous-line curve 401 represents the frequency range that is above the cut-off frequency of the balanced amplifier 105, 205 of the respective amplifier arrangement 100, 200.

It is understood that the curve 400 will drop for the frequency range below the lower cut-off frequency of the signal splitter 102, 202. In addition the curve 401 will drop for the frequency range above an upper cut-off frequency of the balanced amplifier 105, 205.

It can be seen that the power level of the signal amplification for the lower frequency range, i.e. the curve 400, is about 3 dB lower than the power level of the signal amplification for the upper frequency range, i.e. the curve 401.

It is evident from the diagram of FIG. 4 that the usable frequency range of a balanced amplifier can be extended in the lower frequency range with the present invention with a decreased amplification power. The lower frequency range may just exemplarily range from 60 Hz or 80 Hz to 380 MHz, while the upper frequency range may e.g. range from 380 MHz to 8 GHz.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 100, 200 amplifier arrangement
101, 201 broadband signal
102, 202 signal splitter
103, 203 first split signal
104, 204 second split signal
105, 205 balanced amplifier
106, 206 resistance
107, 207 single amplified broadband signal
210 splitter input port
211 first splitter output port
212 second splitter output port
213 first directional coupler
214 first input port
215 second input port
216 first output port
217 second output port
220 first decoupled signal
221 second decoupled signal
222 first amplifier unit
223 second amplifier unit
224 amplified first decoupled signal
225 amplified second decoupled signal
226 second directional coupler
227 first coupler input port
228 second coupler input port
229 first coupler output port
230 second coupler output port
400, 401 curve
S1-S4 method steps

The invention claimed is:

1. An amplifier arrangement for amplifying a broadband signal, the amplifier arrangement comprising:
a signal splitter configured to receive the broadband signal and output a first split signal and a second split signal, and
a balanced amplifier that is coupled to the signal splitter and which is configured to amplify the first split signal and the second split signal and which is further configured to output a single amplified broadband signal based on the amplified first split signal and the amplified second split signal,
wherein the signal splitter comprises a splitter input port configured to receive the broadband signal and a first splitter output port and a second splitter output port, wherein the signal splitter is configured to output the first split signal within a first frequency range via the first splitter output port and to output the second split signal within a second frequency range via the second splitter output port, and
wherein the first and the second frequency range are adjacent to each other of slightly overlap each other.

2. The amplifier arrangement of claim 1, wherein the signal splitter comprises a diplexer.

3. The amplifier arrangement of claim 1, wherein the balanced amplifier comprises:
a first directional coupler that is coupled to the signal splitter and is configured to receive the first split signal and the second split signal and to output a first decoupled signal and a second decoupled signal,
a first amplifier unit that is coupled to the first directional coupler and is configured to receive and amplify the second decoupled signal,
a second amplifier unit that is coupled to the first directional coupler and is configured to receive and amplify the first decoupled signal, and
a second directional coupler that comprises a first coupler input port and a second coupler input port and a first coupler output port and a second coupler output port, wherein the first coupler input port is coupled to the first amplifier unit and the second coupler input port is coupled to the second amplifier unit and wherein the second directional coupler is configured to output the amplified broadband signal via the first coupler output port.

4. The amplifier arrangement of claim 3, wherein the first directional coupler comprises a first input port and a second input port and a first output port and a second output port and wherein the first amplifier unit is coupled to the second output port and the second amplifier unit is coupled to the second output port.

5. The amplifier arrangement of claim 4, wherein the first splitter output port of the diplexer is coupled with the first input port of the first directional coupler, and wherein the second splitter output port of the diplexer is coupled with the second input port of the first directional coupler.

6. The amplifier arrangement of claim 5, wherein the diplexer is configured to provide the first split signal via the first splitter output port with a frequency range above a cut-off frequency of the first directional coupler, and wherein the diplexer (202) is configured to provide the second split signal via the second splitter output port with a frequency range below a cut-off frequency of the first directional coupler.

7. A method for amplifying a broadband signal, the method comprising:
receiving (the broadband signal,
splitting the broadband signal into a first split signal and a second split signal,
amplifying the first split signal and the second split signal in a balanced amplifier, and
outputting a single amplified broadband signal based on the amplified first split signal and the amplified second split signal,
wherein the broadband signal is received via a splitter input port of a signal splitter, and splitting comprises outputting the first split signal within a first frequency range via a first splitter output port and outputting the second split signal within a second frequency range via a second splitter output port of the signal splitter, and
wherein the first and the second frequency range are adjacent to each other of slightly overlap each other.

8. The method of claim 7, wherein receiving and splitting is performed by a diplexer.

9. The method of claim 7, wherein amplifying and outputting comprises:
receiving the first split signal and the second split signal at a first directional coupler and outputting a first decoupled signal and a second decoupled signal via the first directional coupler,
amplifying the second decoupled signal with a first amplifier unit, and
amplifying the first decoupled signal with a second amplifier unit, and
receiving the amplified second decoupled signal via a first coupler input port of a second directional coupler and the amplified first decoupled signal via a second coupler input port of a second directional coupler, and outputting the single amplified signal via a first coupler output port of the second directional coupler.

10. The method of claim 9, wherein the second decoupled signal is provided from a second output port of the first directional coupler to the first amplifier unit, and wherein the first decoupled signal is provided from a first output port of the first directional coupler to the second amplifier unit.

11. The method of claim 8, wherein the first split signal is provided from the first splitter output port of the diplexer to the first input port of the first directional coupler, and wherein the second split signal is provided from the second splitter output port of the diplexer to the second input port of the first directional coupler.

12. The method of claim 10, wherein the first split signal is provided from the first splitter output port of the diplexer to the first input port of the first directional coupler, and wherein the second split signal is provided from the second splitter output port of the diplexer to the second input port of the first directional coupler.

13. The method of claim 11, wherein splitting comprises providing the first split signal with a frequency range above a cut-off frequency of the first directional coupler, and providing the second split signal with a frequency range below a cut-off frequency of the first directional coupler.

14. The amplifier arrangement of claim 2, wherein the first splitter output port of the diplexer is coupled with the first input port of the first directional coupler, and wherein the second splitter output port of the diplexer is coupled with the second input port of the first directional coupler.

* * * * *